United States Patent
Lee et al.

(10) Patent No.: US 6,297,966 B1
(45) Date of Patent: Oct. 2, 2001

(54) MEMORY MODULE HAVING IMPROVED HEAT DISSIPATION AND SHIELDING

(75) Inventors: Shun-Jung Lee, Pan-Chiao; Hsieh-Kun Lee, Chung-Ho, both of (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/397,493

(22) Filed: Sep. 15, 1999

(30) Foreign Application Priority Data

Dec. 24, 1998 (TW) .................................................. 87221543

(51) Int. Cl.⁷ ................................. H05K 7/14; H05K 9/00
(52) U.S. Cl. .......................... 361/799; 361/728; 361/752; 361/736; 361/759; 361/801; 175/51
(58) Field of Search ...................................... 361/715, 728, 361/736, 737, 740, 752, 753, 759, 800, 799, 801; 174/51, 35 R; 439/946; 24/455, 563; 70/174

(56) References Cited

U.S. PATENT DOCUMENTS

| | | | |
|---|---|---|---|
| 5,109,318 | * 4/1992 | Funari et al. | 361/710 |
| 5,309,181 | * 5/1994 | Ota et al. | 346/145 |
| 5,422,790 | * 6/1995 | Chen | 361/719 |
| 5,502,620 | * 3/1996 | Funck et al. | 361/753 |

* cited by examiner

Primary Examiner—Jayprakash N. Gandhi
(74) Attorney, Agent, or Firm—Wei Te Chung

(57) ABSTRACT

A memory module assembly in accordance with the present invention comprises a memory module, such as a RAM module, and a pair of shells for enclosing the RAM module. The RAM module comprises a printed circuit board (PCB), a plurality of memory chips attached on the PCB and a plurality of related electronic elements disposed near the chips. A securing means comprises a clasp for fixing the PCB and the shells together at a middle portion proximate upper edges of the PCB and the shells, and a pair of rivets extending through corresponding positioning apertures defined proximate a bottom edge of the PCB and corresponding apertures defined proximate a bottom edge of the shell. The clasp is resilient and comprises a shoulder and a pair of resilient arms inwardly extending from opposite ends of the shoulder for securing the PCB and the shells together. The clasp can also integrally extend from an upper edge of each shell for being bent to secure the PCB and the shells together after the RAM module is assembled with the shells.

15 Claims, 4 Drawing Sheets

MEMORY MODULE HAVING IMPROVED HEAT DISSIPATION AND SHIELDING

BACKGROUND OF THE INVENTION

The present invention relates to a memory card module, and particularly to a random access memory (RAM) module having excellent heat dissipation and shielding characteristics.

DESCRIPTION OF THE PRIOR ART

As functional capabilities of a computer continually expand and the amount of data manipulated by the computer also increases, requirements placed on the performance of a memory card module, such as a Dual In-Line Memory Module (DIMM), are becoming more strict. A conventional DIMM is usually inserted into a card edge connector mounted on a mother board. The card edge connector commonly comprises an elongate dielectric housing, a pair of guiding towers vertically and outwardly extending from opposite ends of the housing for guiding the DIMM to electrically connect with the card edge connector, and an ejector mounted on the guiding posts for ejecting the DIMM out of the card edge connector. A latching means is formed on the ejector for securely positioning the DIMM therein, and a plurality of contacts is received in the housing. Each contact comprises a portion for insertion in the corresponding passageway, and a tail portion for being soldered to the mother board to provide electrical communication between the DIMM and related circuitry formed on the mother board.

The DIMM comprises a printed circuit board (PCB), a plurality of memory chips mounted on the PCB, and a plurality of related electronic elements mounted on the PCB. A plurality of golden fingers is formed on opposite sides of a bottom edge of the PCB for electrically engaging the contacts of the card edge connector. A plurality of latching notches or openings is defined at opposite ends of the DIMM for securing with the latching means of the ejector.

However, since memory capability and transmission speed of the memory card module have been greatly increased, problems resulting from heat dissipation and electromagnetic interference adversely affect signal transmission quality. Therefore, an improved RAM bus module having excellent heat dissipation and anti-electromagnetic interference characteristics is requisite.

BRIEF SUMMARY OF THE INVENTION

A main object of the present invention is to provide a RAM bus module having excellent heat dissipation and anti-electromagnetic interference characteristics.

A memory module assembly in accordance with the present invention comprises a memory module, and a pair of shells for enclosing the RAM module. The memory module comprises a printed circuit board (PCB), a plurality of memory chips attached on the PCB and a plurality of related electronic elements disposed near the chips. A securing means comprises a clasp for fixing the PCB and the shells together, and a pair of rivets extending through corresponding positioning apertures defined proximate a bottom edge of the PCB and corresponding apertures defined proximate a bottom edge of the shell. The clasp is resilient and comprises a shoulder and a pair of resilient arms inwardly extending from opposite ends of the shoulder for securing the PCB and the shells together. The clasp can also integrally extend from an upper edge of each shell for being bent to secure the PCB and the shells together after the RAM module is assembled with the shells.

Other objects, advantages and novel features of the invention will become more apparent from the following detailed description when taken in conjunction with the accompanying drawings.

DETAILED DESCRIPTION OF THE INVENTION

Figure 1:
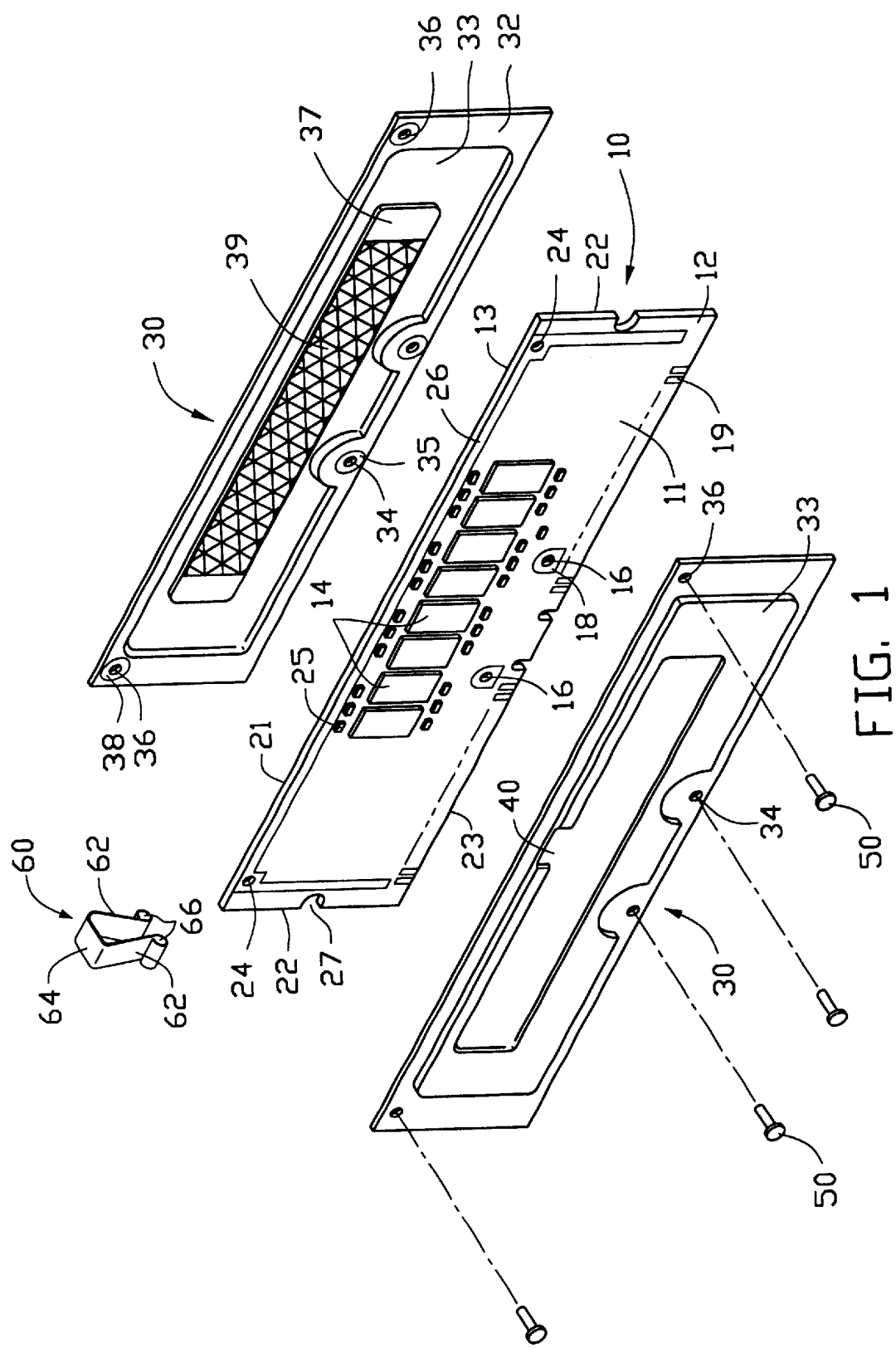
FIG. 1 is an exploded view of a memory card in accordance with a first embodiment of the present invention.
Figure 2:
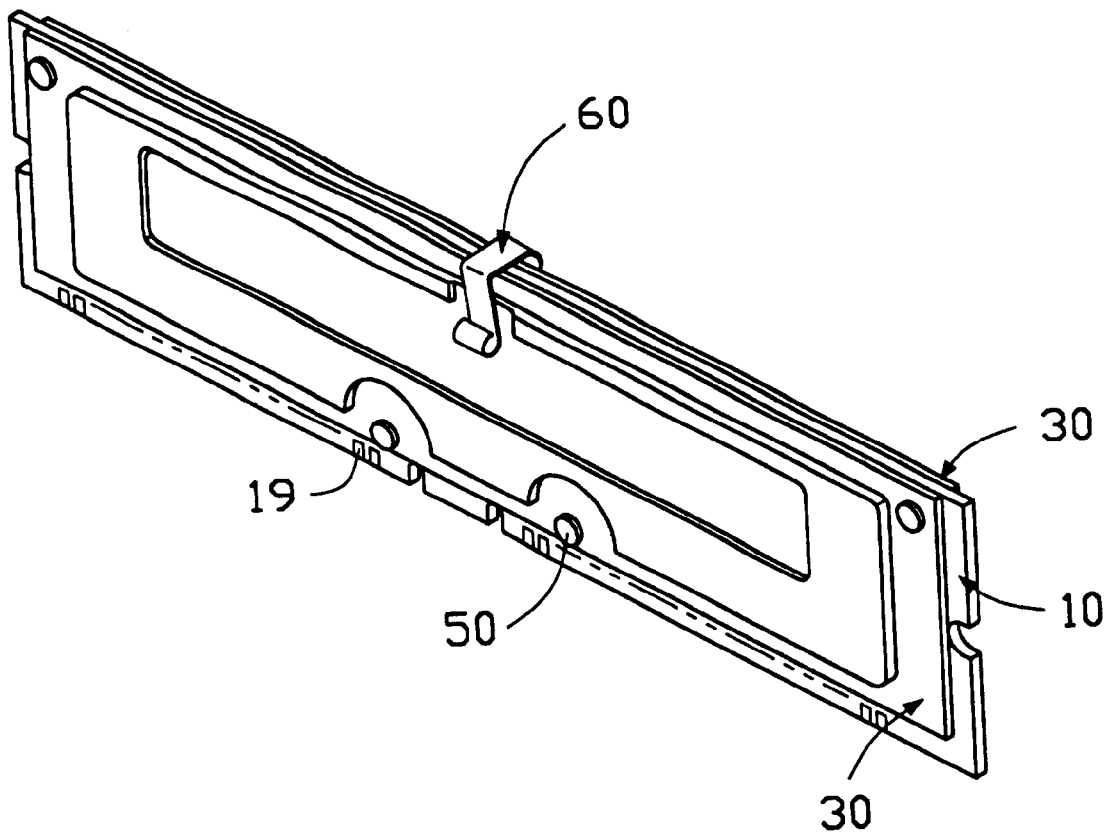
FIG. 2 is an assembled view of FIG. 1.

Referring to FIGS. 1 and 2, a memory module assembly in accordance with the present invention comprises a memory module, such as a RAM module 10, and a pair of shells 30 for enclosing the RAM module 10. The RAM module 10 includes a printed circuit board (PCB) 12, a plurality of memory chips 14 attached to the PCB 12, and a plurality of related electronic elements 25 disposed near the chips 14 on the PCB 12. The chips 14 are aligned with each other and are soldered onto middle portions of front and rear surfaces 11, 13 of the PCB 12. A plurality of golden fingers 19 are formed on the front and rear surfaces 11, 13 of a bottom edge 23 of the PCB 12 for electrically contacting corresponding terminals of a mating card edge connector (not shown). A plurality of notches 27 is defined in opposite lateral edges 22 of the PCB 12 and the bottom edge 23.

A pair of symmetrical apertures 16 is defined through the PCB 12 between the chips 14 and the golden fingers 19. The apertures 16 are aligned with each other parallel to the chips 14. A first metallic grounding portion 18 is formed around each aperture 16. A second metallic grounding portion 26 has an inverted U-shape and extends along an upper edge 21 and the opposite lateral edges 22 of the front and rear surfaces 11, 13 of the PCB 12. A pair of positioning holes 24 is defined in opposite ends of the PCB 12 proximate the upper edge 21.

Each shell 30, stamped and formed from a thin sheet of metal, comprises an outwardly extending shroud 33, a recessed plate 37 being inwardly punched from the shroud 33 for abutting against the chips 14 and the related electronic elements of the PCB 12, and a periphery 32 surrounding the shroud 33. A heat conducting coat 39 is attached to an inner face of the recessed plate 37 for facilitating heat dissipation from the PCB 12 therethrough. A pair of holes 36 is defined in each shell 30 corresponding to the positioning holes 24 of the PCB 12 for extension of rivets 50 therethrough. A pair of first contact portions 35 inwardly extends from a bottom portion of the shroud 33 for electrically contacting the corresponding grounding portion 18 of the PCB 12. A positioning aperture 34 is defined in a middle of each first contact portion 35 corresponding to the positioning apertures 16 of the PCB 12. A second contact portion 38 is formed around each hole 36 on an inner surface of the periphery 32 of each shell 30. Each shell 30 is completely anodized except for the first and second contact portions 35, 38 for preventing contamination, enhancing heat dissipation capabilities, and improving aesthetic quality of the RAM module. The rivets 50 are inserted into the corresponding holes 36 and apertures 34 of one of the shells 30, and are anodized together with the shell 30.

In assembly, the shroud 33 of each shell 30 is disposed to receive the chips 14 and the related electronic elements therein. The holes 36 and the apertures 34 of each shell 30 align with the corresponding positioning holes 24 and the corresponding positioning apertures 16 of the PCB 12. The first and second contact portions 35, 38 of each shell 30 simultaneously align with the corresponding first and second grounding portions 18, 26 of the PCB 12. The rivets 50 are then fixed into the corresponding holes 36 and apertures 34 of the shells 30 via the positioning holes 24 and the positioning apertures 16 of the PCB 12. The golden fingers 19 and the notches 27 remain exposed outside the shells 30 for engaging with the mating card edge connector.

The rivets 50 are only fixed to upper and lower portions of the PCB 12 and the shells 30. A middle portion proximate the upper edge 21 of the PCB 12 and upper edges of the shells 30 remains unsecured. Since the chips 14 and the related electronic elements are disposed just below the middle portion of the PCB 12, a resilient clasp 60 is provided to secure the shells 30 and the PCB 12 at the middle portion of the upper edge 21 of the PCB 12. A recess 40 is defined in a middle of a top portion of the shroud 33 proximate the recessed plate 37 of each shell 30 for receiving the clasp 60. The clasp 60 comprises a shoulder 64 and a pair of clamping arms 62 downwardly and inwardly extending from opposite ends of the shoulder 64 for clamping the shells 30 together. A pair of curved portions 66 outwardly extends from free ends of the clamping arms 62 for facilitating insertion of the clasp 60.

Figure 3:
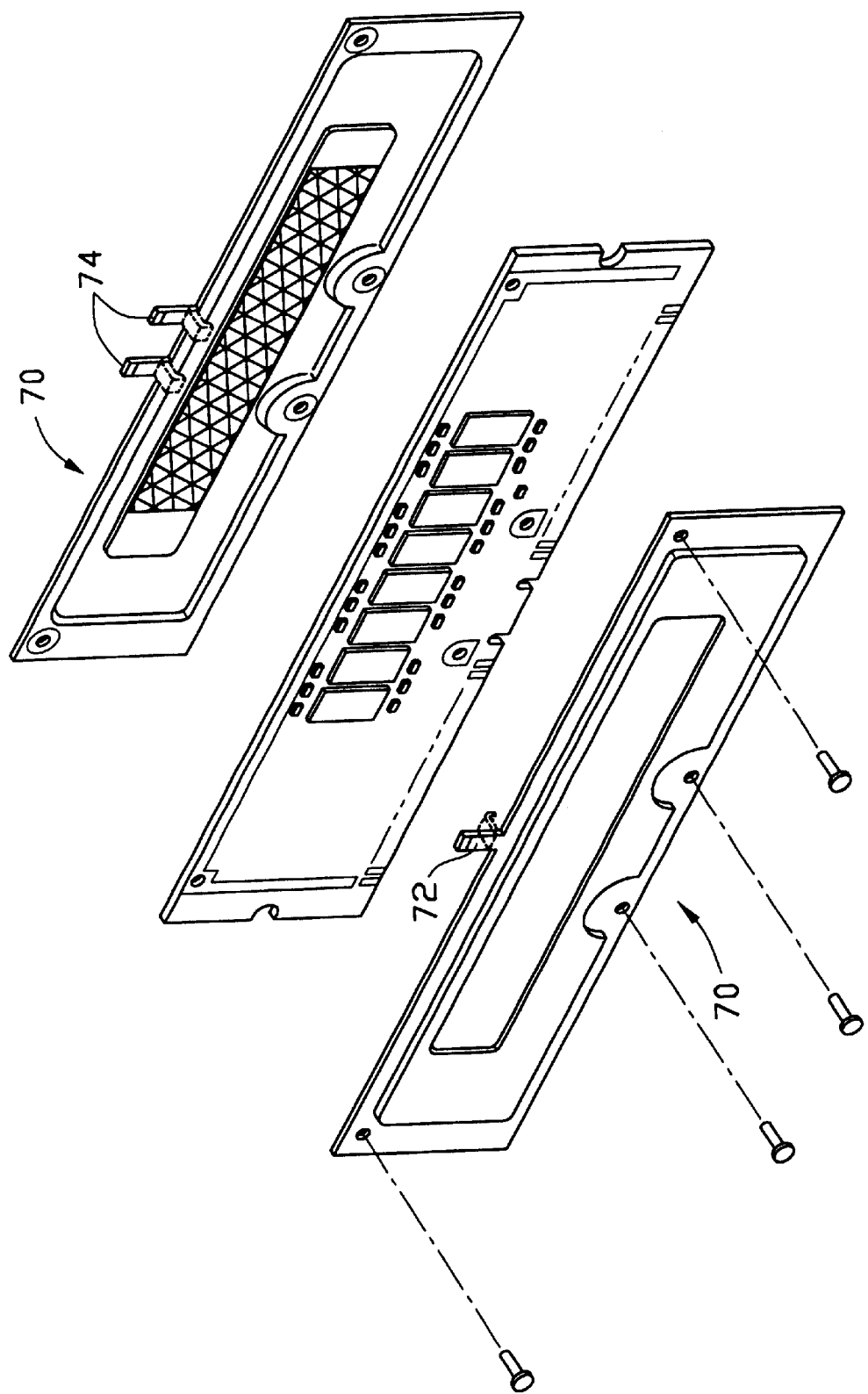
FIG. 3 is an exploded view of an memory card in accordance with a second embodiment of the present invention.
Figure 4:
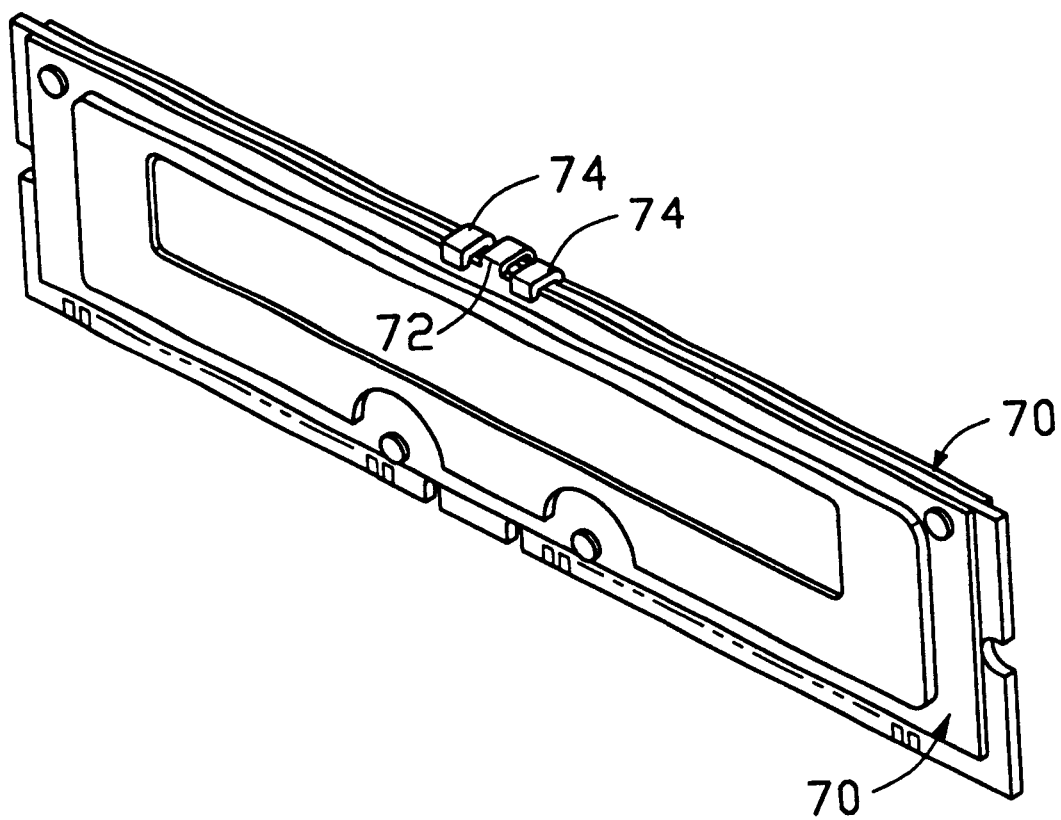
FIG. 4 is an assembled view of FIG. 3.

Referring also to FIGS. 3 and 4, in a second embodiment of the present invention, a clasp 72 integrally and outwardly extends from a middle portion of the upper edge of one shell 70, while a pair of clasps 74 integrally and outwardly extends from a middle portion of the upper edge of the other shell 70. When the shells 70 are assembled to enclose the RAM module 10, the clasps 72, 74 are bent to engage with each other thereby securing the RAM module 10 and the shells 70 together in cooperation with the rivets 50.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A memory module assembly comprising:
   a memory module comprising a printed circuit board (PCB), a plurality of chips and related electronic elements mounted on the PCB, a grounding portion formed on a bottom edge of the PCB, and a positioning aperture defined in the grounding portion;
   a metallic shell comprising a shroud for enclosing the chips and the related electronic elements therein, and a first contact portion formed at a bottom portion of the shroud for electrically contacting the grounding portion of the memory module thereby forming a grounding path, an aperture being defined in the contact portion; and
   a securing means comprising a rivet for being riveted into the positioning aperture of the PCB and the aperture of the metallic shell thereby fixing the memory module and the metallic shell together, and a clasp for retaining the memory module and the metallic shell together at an upper edge of the PCB and an upper edge of the metallic shell.

2. The memory module assembly as claimed in claim 1, wherein the clasp comprises a shoulder and a pair of resilient arms inwardly extending from opposite ends of the shoulder for securing the metallic shell and the memory module together.

3. The memory module assembly as claimed in claim 2, wherein each resilient arm forms a curved portion at a free end thereof for facilitating smooth insertion of the metallic shell and the PCB between the resilient arms of the clasp.

4. The memory module assembly as claimed in claim 2, wherein the shroud of the metallic shell defines an inwardly punched recess proximate an upper edge thereof for interferentially receiving/retaining a corresponding resilient arm of the clasp.

5. The memory module assembly as claimed in claim 1, wherein the clasp outwardly and integrally extends from an upper edge of the metallic shell and is bent to secure the shell and the memory module together.

6. The memory module assembly as claimed in claim 1, wherein a pair of holes is defined in opposite ends of the metallic shell proximate an upper edge thereof; and the securing means further comprises a pair of rivets for engaging with the holes of the metallic shell and a pair of positioning holes defined in opposite ends of the PCB proximate an upper edge thereof thereby fixing the PCB and the metallic shell together.

7. The memory module assembly as claimed in claim 6, wherein a second contact portion is formed around each hole of the metallic shell; and a second grounding portion is formed around each positioning hole of the PCB for electrically contacting the second contact portion of the metallic shell.

8. The memory module assembly as claimed in claim 7, wherein the metallic shell is anodized except for the first and second contact portions.

9. The memory module assembly as claimed in claim 1, wherein a recessed plate is inwardly formed from the shroud for abutting against the chips of the memory module thereby facilitating heat dissipation therefrom.

10. The memory module assembly as claimed in claim 1 further comprising another metallic shell for cooperating with the metallic shell to enclose the PCB therein.

11. The memory module assembly as claimed in claim 1, wherein said another metallic shell forms a clasp outwardly extending from an upper edge for engaging with the metallic shell thereby enclosing the memory module therein.

12. A memory module assembly comprising:
   a memory module including a substrate having a plurality of electronic elements mounted thereon, said memory module further forming a grounding portion at adjacent a bottom edge thereof;
   a metallic shell enclosing said memory module and having a portion electrically connected to said grounding portion of said memory module; and
   securing means between said memory module and said metallic shell, wherein the securing means includes a positioning aperture defined in the grounding portion of the substrate, an aperture defined in the metallic shell corresponding to the positioning aperture and a rivet being riveted into the position aperture of the substrate and the aperture of the metallic shell thereby securely assembling said memory module and said metallic shell together.

13. The memory module assembly as claimed in claim 12, wherein the securing means includes a clasp for retaining the memory module and the metallic shell together at an upper edge of the PCB and an upper edge of the metallic shell.

14. The memory module assembly as claimed in claim 12, wherein said bottom edge and two side edges of the memory module project out of the shell and are exposed to an exterior.

15. The memory module assembly as claimed in claim 14, wherein said memory module further includes another grounding portion adjacent said side edges thereof.

* * * * *